United States Patent [19]

Schlig et al.

[11] Patent Number: 4,639,678
[45] Date of Patent: Jan. 27, 1987

[54] ABSOLUTE CHARGE DIFFERENCE DETECTION METHOD AND STRUCTURE FOR A CHARGE COUPLED DEVICE

[75] Inventors: Eugene S. Schlig, Somers, N.Y.; Savvas G. Chamberlain, Waterloo, Canada

[73] Assignee: International Business Machines Corporation, Armonk, N.Y.

[21] Appl. No.: 567,220

[22] Filed: Dec. 30, 1983

[51] Int. Cl.$^4$ .................. G01R 29/24; G01R 29/12; H01L 29/78; G11C 19/28
[52] U.S. Cl. .................................. 324/457; 357/24; 377/62
[58] Field of Search ............ 357/24; 377/57–63; 324/457

[56] References Cited

U.S. PATENT DOCUMENTS

| | | | |
|---|---|---|---|
| 4,072,939 | 2/1978 | Heller et al. | 357/24 |
| 4,104,543 | 8/1978 | Maeding | 357/24 |
| 4,239,983 | 12/1980 | Edwards | 357/24 |
| 4,303,839 | 12/1981 | Berger et al. | 357/24 |
| 4,323,791 | 4/1982 | Berger et al. | 357/24 |
| 4,374,334 | 2/1983 | Engeler | 357/24 |

OTHER PUBLICATIONS

Baertsch et al., "A New Surface Charge Analog Store", IEEE Int. Electron Devices Meeting (12/73), Tech. Dig., pp. 134–137.

Primary Examiner—Gene M. Munson
Attorney, Agent, or Firm—John J. Goodwin

[57] ABSTRACT

Two unknown charge packets are stored in adjacent potential wells of equal depth in a charge coupled device. The charge packets are then merged by changing the potential on an intermediate merge electrode to remove a potential barrier between the two wells. The potential barrier is then re-established, and a current is induced through one of the electrodes which established the two wells of equal depth, and that current is integrated as a measure of the original absolute difference between the two charge packets.

5 Claims, 1 Drawing Figure

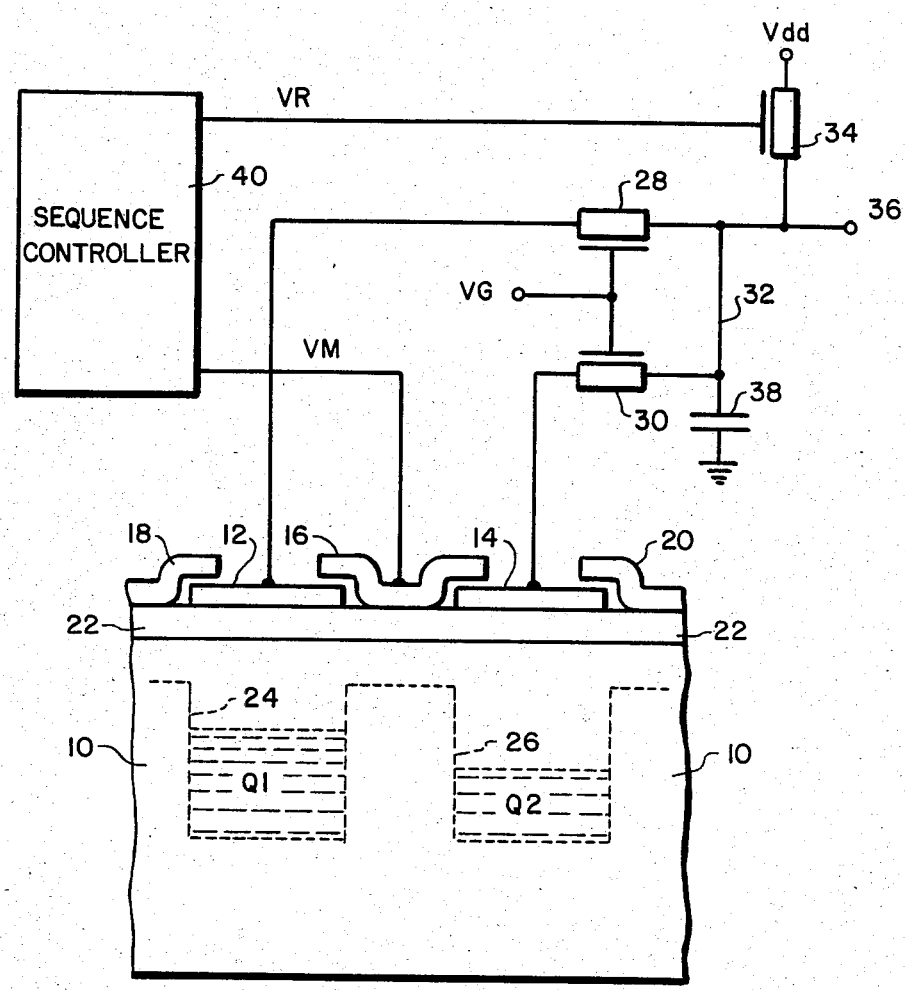

ABSOLUTE CHARGE DIFFERENCE DETECTION METHOD AND STRUCTURE FOR A CHARGE COUPLED DEVICE

DESCRIPTION

Technical Field

This invention relates to a circuit for determining the absolute difference between two charge packets in a charge coupled device. The invention is particularly useful in connection with charge coupled analog image processing, as well as in charge coupled device analog-to-digital converters.

Background Art

In charge coupled analog image processing structures, it is very useful to be able to determine the absolute value of the difference between two charge packets, that is the value of the charge difference without regard to which charge packet is greater.

The invention is particularly useful in some image processing systems, for instance such as the systems described in a U.S. patent application Ser. No. 509,831 filed by S. G. Chamberlain, et al, on June 29, 1983 for an "On-Chip CCD Realization of the Laplacian Operator for Image Signal Processing", and assigned to the same assignee as the present application.

The invention is also useful in analog to digital converters of the type described for instance by R. A. Blauschild in an article entitled "An 8 b 50 ns Monolithic A/D Converter with Internal S/H" which appears at pages 178-179 of the Digest of Technical Papers for the 1983 International Solid State Circuits Conference held on Feb. 23-25, 1983, at New York, N.Y.

Various approaches have been adopted for measuring the size of individual charge packets. One such approach is shown, for instance, in U.S. Pat. No. 4,306,300 issued Dec. 15, 1981 to Louis M. Terman and Yen S. Yee for a MULTI-LEVEL CHARGE-COUPLED DEVICE MEMORY SYSTEM INCLUDING ANALOG-TO-DIGITAL AND TRIGGER COMPARATOR CIRCUITS and assigned to the same assignee as the present application. In that patent there is disclosed a system in which the depth of a potential well containing an unknown charge packet in a charge coupled device is reduced in a stepwise manner until spillover occurs, at which time the detection of the spillover indicates the original size of the charge packet based on a determination of the step at which spillover occurred.

U.S. Pat. No. 4,300,210 issued Nov. 10, 1981 to Chakravarti et al for a CALIBRATED SENSING SYSTEM, and also assigned to the same assignee as the present application, is also of interest. In that patent, the summation of the signals generated in the electrode above an intermediate potential well by transferring an unknown charge packet into and out of that well, and then transferring a standard known charge packet into that well, provides an indication as to whether the unknown charge exceeded or was less than the standard charge packet. This provides a measure of the size of the charge packet.

Since the methods and structures of either of the above patents provide for the measurement of the size of a charge packet, such measurements can obviously be performed twice, and the two measurements compared in order to determine the difference between the two charge packets. Such methods and structures are cumbersome and awkward if the absolute value of the difference between the charge packets is the only information required.

So far as known by the present inventors, no one has previously devised a method or a structure for directly determining the absolute value between two charge packets.

SUMMARY OF THE INVENTION

Accordingly, it is one object of the present invention to provide an improved method and structure for determining the absolute difference between two unknown charge packets without separately measuring those packets and comparing those measurements.

Further objects and advantages of the invention will be apparent from the following description and the accompanying drawing.

In carrying out the invention there is provided A method for determining the absolute value of the difference between two charge packets under two electrodes separated by at least one intermediate electrode in a charge coupled device comprising applying equal potentials at a first potential level to the two electrodes to form potential wells thereunder while maintaining the intermediate electrode at a second potential level to maintain a barrier between the potential wells, introducing signal input charge packets into each of the potential wells, changing the potential on the intermediate electrode towards said first potential level to remove the potential barrier between the wells to cause the charge packets to merge and the potentials under all three electrodes to equalize, changing the potential of the intermediate electrode to said second potential level to restore the potential barrier, and integrating a current induced by the merging of the charge packets through the one of the two separated electrodes originally having the lesser charge packet as a measure of the original absolute difference between the two charge packets.

BRIEF DESCRIPTION OF THE DRAWING

The drawing is a schematic circuit diagram illustrating a preferred embodiment of the invention.

DESCRIPTION OF THE PREFERRED EMBODIMENT

Referring more particularly to the drawing, there is shown, by way of example, an N-channel charge coupled device (CCD) 10. Device 10 is preferably combined with N-channel field effect transistors. It will be understood that the invention can be carried out with other charge coupled device structures and transistor types such as a P-channel CCD and P-channel transistors. The device shown includes a silicon chip 10, which is shown in a partial cross-section, having a two-level overlapping gate structure including two gates 12 and 14, and merge gate 16 together with a gate oxide layer 22. The gates 18 and 20 are part of the CCD apparatus which supplies the two charge packets to be measured. They are not illustrated fully since they are not of major importance to this invention.

Potentials established at the electrodes 12 and 14 are operable to establish potential wells for charge packets beneath them, as illustrated at 24 and 26 in the form of a plot of electron potential in the silicon versus spatial position, aligned to the position of electrodes 12, 14 and 16.

Coupled to the electrodes 12 and 14 respectively are field effect transistors 28 and 30. The drain connections of transistors 28 and 30 are connected in common at a node 32 to the source of another field effect transistor 34. Transistor 34 is sometimes referred to hereinafter as a voltage supply and isolation transistor. The drain of transistor 34 is connected to a drain voltage Vdd, which is positive in polarity for an N-channel device. The node 32 also serves as the output connection from the circuit, as indicated by the terminal 36. A capacitance is shown at 38 connected between the node 32 and ground, and represents the capacitance of the drains of transistors 28 and 30 and of the source of transistor 34, plus additional capacity which is preferably added to increase the output retention time.

The gates of transistors 28 and 30 are connected to a gate voltage VG of the same polarity as Vdd. Preferably, VG is less than or equal to the sum of the threshold voltage of transistors 28 and 30 and the lowest operating voltage of node 32. A sequence controller 40 is operable to provide timed signals VR to the gate electrode of transistor 34 and VM to the merge gate 16. These signals are positive in polarity for an N-channel device.

The field effect transistors 28, 30, and 34, and the capacitor 38, as well as the components of the sequence controller 40 (whch are not shown in detail), are preferably integrated into the same circuit chip as the charge coupled device 10.

The operation of the structure of FIG. 1 is as follows: The control voltage pulse VR (reset) rises, making transistor 34 conductive, and charging the capacitor 38 to a potential at, or below, the drain voltage Vdd.

The voltage VG supplied to the gates of transistors 28 and 30 makes those transistors conductive, charging the gate electrodes 12 and 14 to a potential equal to VG minus VT, where VT is the threshold voltage of the transistors 28 and 30. The potentials on electrodes 12 and 14 establish the potential wells 24 and 26 beneath those electrodes. Signal input charge packets Q1 and Q2 are then introduced into the potential wells 24 and 26 by a known charge coupled device charge transfer method, such as by the operation of transfer electrodes 18 and 20, to transfer charges from adjacent potential wells (not shown). In the meantime, the voltage signal VM applied by the sequence controller 40 to the merge gate 16 is held at a low value to provide a barrier and isolate the two wells 24 and 26 in FIG. 1, Q1 and Q2 are illustrated as shaded regions within potential wells 24 and 26 respectively. The depth of the shaded region represents both the quantity of charge and the potential change in the silicon resulting from the introduction of charge.

The introduction of the charge packets Q1 and Q2 into the wells 24 and 26 induces negative transients into electrodes 12 and 14. This transiently increases the conduction in transistors 28 and 30 to thereby restore the potential on those electrodes to VG minus VT.

Next, the control voltage VR for transistor 34 falls, terminating conduction in transistor 34, and isolating the output node 32.

Next, the voltage VM on the merge gate 16 rises, removing the potential barrier between the wells 24 and 26 and the charge packets Q1 and Q2. The rise of the voltage on the merge electrode 16 also induces positive transients into the electrodes 12 and 14 through stray capacitances, which shift the operating points of transistors 28 and 30 slightly away from conduction.

In response to removal of the barrier under merge electrode 16, the charge packets Q1 and Q2 mix, and the potentials under electrodes 12, 14, and 16 tend to equalize, and tend toward a potential which, because of the added charge capacity under merge electrode 16, is slightly higher (a lower quantity of negative charge) than the average of the potentials formerly under electrodes 12 and 14.

The voltage VM on merge gate 16 then falls, restoring the potential barrier. Negative transients now counteract and cancel the error in the potential of electrodes 12 and 14 caused by the positive transients arising from the initial removal of the barrier. The added charge capacity under merge electrode 16 is eliminated, and the potentials under electrodes 12 and 14 both tend towards exactly the average of the original charge packets Q1 and Q2. If the initial value of the negative charge packet Q1 is greater than Q2, as illustrated in the drawing, the potential under electrode 12 has a net increase after equalization, while that under electrode 14 has a net decrease, both by one-half of the original difference between the potentials due to the charge packets.

As a result, a positive transient is induced through electrode 12, which turns transistor 28 off harder, while a negative transient potential is induced into electrode 14, which causes transistor 30 to conduct. Transistor 30 conducts until the potential of electrode 14 returns to the value VG minus VT. The conduction generates a drain current which reduces the potential across capacitor 38. The voltage change across capacitor 38 appears at the output node 32, terminal 36, and is proportional to the magnitude of the initial difference between the charge packets Q1 and Q2.

The charge packets Q1 and Q2 (as now equalized) can now be removed, so a new pair of signal charge packets can be introduced and measured. Removal is accomplished by any known charge coupled device technique, such as by a drop-clock method, into deeper adjacent potential wells (not shown). Another method is by the known push-clock technique which uses two additional field effect transistors and an additional clock pulse to lower the potential of electrodes 12 and 14.

It will be apparent that no matter which one of the charge packets is greater, the circuit will accurately measure the difference between the two charge packets. Thus, in the final measuring step, if the initial charge packet in well 26 had been greater than that in well 24, transistor 28 would have been conductive in the final step to change the charge on capacitor 38, rather than transistor 30.

The change in the charge on capacitor 38 in the final step may be characterized as an integration.

While this invention has been shown and described in connection with a particular preferred embodiment, various alterations and modifications will occur to those skilled in the art. Accordingly, the following claims are intended to define the valid scope of this invention over the prior art, and to cover all changes and modifications falling within the true spirit and valid scope of this invention.

Having thus described our invention, what we claim as new, and desire to secure by Letters Patent is:

1. A method for determining the absolute value of the difference between two charge packets in a charge coupled device including a semiconductor substrate having overlying electrodes comprising placing the charge packets in separate potential wells in the semiconductor substrate of the charge coupled device separated by a potential barrier, merging the charge packets by removing the barrier, and integrating the electrical signals induced into the overlying electrodes of the charge coupled device by the merger of the charge packets as a measure of the original absolute difference between the two charge packets, the same first level potential being applied to the two electrodes overlying the separate potential wells to maintain wells of equal depth, while maintaining an intermediate electrode at a second potential level to maintain the potential barrier between the potential wells, the barrier being removed by changing the potential on the intermediate electrode to cause the charge packets to merge and the potentials under all three electrodes to equalize, changing the potential of the intermediate electrode to restore the potential barrier, and integrating a current induced by the merging of the charge packets through the one of the two overlying electrodes originally having the lesser charge packet as a measure of the original absolute difference between the two charge packets.

2. A structure for determining the absolute value of the difference between two charge packets in a charge coupled device comprising a charge coupled device including a semiconductor substrate and having at least three electrodes with one of said electrodes being positioned between the other two electrodes to serve as a merge control electrode, means for applying the same first potential to each of said two separate electrodes to form potential wells thereunder, means for supplyng a second potential to said merge electrode and operable for maintaining a barrier between said potential wells, means for introducing unknown signal input charge packets into each of said potential wells, said merge electrode potential supply means being operable to change the potential on said merge electrode toward said first potential to remove the potential barrier between said wells to merge the charge packets and to cause the potentials under all three electrodes to equalize, said merge electrode voltage supply means being operable to restore said merge electrode to the second potential to restore the potential barrier, means operable upon the restoration of the potential barrier for integrating a current induced through the one of the two separated electrodes originally having the lesser charge packet as a measure of the original absolute difference between the two charge packets.

3. A structure as claimed in claim 2 wherein said means for applying said first potential to said two separate electrodes comprises two field effect transistors respectively connected to said two separate electrodes from the source electrodes of said transistors, the drains of said transistors being connected to a common node, a voltage supply connectable to said common node, and the gate electrodes of said transistors being connected in common to a second voltage supply.

4. A structure as claimed in claim 3 wherein a capacitor is connected to said common node, said transistors and said capacitor comprising said current integrating means, and said common node comprising a signal output terminal.

5. A structure as claimed in claim 4 wherein said first voltage supply comprises a voltage supply and isolation field effect transistor having a source connection to said common node and having a drain connection to a supply voltage, said last named transistor being operable to supply a voltage to the drains of said two transistors connected to said capacitor for the establishment of the potential wells, said voltage supply and isolation transistor being operable to become non-conductive to thereby isolate said common node before the current integration is carried out by said current integrating means.

* * * * *